United States Patent
Song et al.

(10) Patent No.: US 9,237,001 B1
(45) Date of Patent: Jan. 12, 2016

(54) METHOD AND APPARATUS TO CALIBRATE DUTY CYCLE DISTORTION

(71) Applicant: ALTERA CORPORATION, San Jose, CA (US)

(72) Inventors: Ting Lok Song, Bayan Lepas (MY); Wai Tat Wong, Bukit Mertajam (MY)

(73) Assignee: Altera Corporation, San Jose, CA (US)

( * ) Notice: Subject to any disclaimer, the term of this patent is extended or adjusted under 35 U.S.C. 154(b) by 61 days.

(21) Appl. No.: 14/159,248

(22) Filed: Jan. 20, 2014

(51) Int. Cl.
  *H04B 3/46* (2015.01)
  *H04B 17/00* (2015.01)
  *H04Q 1/20* (2006.01)
  *H04L 7/00* (2006.01)

(52) U.S. Cl.
  CPC .................................. *H04L 7/0016* (2013.01)

(58) Field of Classification Search
  CPC .................................................... H04L 7/0016
  USPC ................................................. 375/244, 224
  See application file for complete search history.

(56) References Cited

U.S. PATENT DOCUMENTS

| | | |
|---|---|---|
| 5,157,277 A | 10/1992 | Tran et al. |
| 5,294,848 A | 3/1994 | Kannegundla |
| 6,081,162 A | 6/2000 | Johnson |
| 6,933,759 B1 | 8/2005 | Wu et al. |
| 7,447,134 B2 | 11/2008 | Chou et al. |
| 7,661,010 B2 | 2/2010 | DeFazio et al. |
| 7,675,336 B1 * | 3/2010 | Foo et al. ...................... 327/175 |
| 7,839,192 B1 * | 11/2010 | Wang ............................ 327/175 |
| 7,999,588 B1 * | 8/2011 | Pan et al. ..................... 327/175 |
| 8,125,259 B2 | 2/2012 | Dai et al. |
| 8,258,825 B2 | 9/2012 | Hung et al. |
| 8,421,501 B1 | 4/2013 | Rien et al. |
| 8,588,014 B1 | 11/2013 | Fung et al. |
| 2007/0024338 A1 * | 2/2007 | Shumarayev et al. ........ 327/175 |
| 2011/0304371 A1 * | 12/2011 | Ravi et al. .................... 327/175 |
| 2014/0035650 A1 * | 2/2014 | Zerbe et al. ................... 327/299 |

* cited by examiner

*Primary Examiner* — Nader Bolourchi
(74) *Attorney, Agent, or Firm* — Okamoto & Benedicto LLP

(57) ABSTRACT

One embodiment relates to a method of calibrating duty cycle distortion. A data rate of a physical layer interface is changed from a lower rate to a higher rate, and a data rate of one or more transceivers associated with the physical layer interface is changed from the lower rate to the higher rate. An electrical idle state is maintained after changing the data rate of the transceiver. Duty cycle distortion calibration for one or more transceivers associated with the physical layer interface is then performed during the electrical idle state. Other embodiments and features are also disclosed.

17 Claims, 5 Drawing Sheets

FIG. 4    400

METHOD AND APPARATUS TO CALIBRATE DUTY CYCLE DISTORTION

BACKGROUND

1. Technical Field

The present invention relates generally to serial interfaces for integrated circuits.

2. Description of the Background Art

Serial interfaces are used to communicate data between devices in a system. Serial interface protocols have been developed at increasingly fast data rates. Examples of industry-standard protocols for serial interfaces include PCI Express® (Peripheral Component Interconnect Express), XAUI (X Attachment Unit Interface), sRIO (serial Rapid IO), and many others.

As the data rates of serial interfaces have increased beyond one gigabit-per-second, jitter has become a significant performance limitation. Jitter relates to the deviation in time of signal transitions from their ideal transition points.

Sources of jitter may be categorized as either random or deterministic. One type of deterministic jitter of particular interest in this case is jitter caused by duty cycle distortion (DCD).

SUMMARY

One embodiment relates to a method of calibrating duty cycle distortion. A data rate of a physical layer interface is changed from a lower rate to a higher rate, and a data rate of one or more transceivers associated with the physical layer interface is changed from the lower rate to the higher rate. An electrical idle state is maintained after changing the data rate of the transceiver. Duty cycle distortion calibration for one or more transceivers associated with the physical layer interface is then performed during the electrical idle state.

Other embodiments and features are also disclosed.

DETAILED DESCRIPTION

Signal jitter in a transceiver channel may be improved by minimizing and calibrating the Duty Cycle Distortion (DCD) of the transmitter high speed serial clock in noisy conditions. For example, a transceiver channel operating at 5.0 Gigabits per second (Gb/s) and above may run into signal jitter violation if there is no means to initiate DCD calibration. This scenario may occur, for instance, in a PCI Express™ (PCIe™) Endpoint with CVP (Configuration Via PCIe™ link) enabled.

Applicants have determined that a maximum allowed level for signal jitter may be violated in an Endpoint with CVP in the following scenario, for example. In this scenario, consider an Endpoint from cold boot up until user mode is entered after completion of CVP. From cold boot up of the Endpoint to completion of CVP, only very few channels are typically active concurrently. Hence, signal jitter may be contained during this first period such that a violation does not occur even if CVP was enabled at 5.0 Gbps and above. However, when the Endpoint switches from CVP to user mode at speed 5.0 Gbps or higher, many other transceiver channels are expected to be up, active and toggling simultaneously. This causes higher crosstalk between transceiver channels, and, as a result, the maximum allowed level of signal jitter may be violated during this second period.

Applicants have further determined that correcting signal jitter by DCD calibration before entering user mode (i.e. between cold boot up to the completion of CVP) is problematic. This is because the reconfiguration controller for the transceiver is not ready for operation before CVP completes. The DCD calibration requires the reconfiguration controller because the reconfiguration controller stores and maintains the appropriate settings for DCD calibration. Once the reconfiguration controller detects that the link has gone into electrical idle, the reconfiguration controller may initiate and load the appropriate settings for DCD calibration. DCD calibration may be executed only in electrical idle to prevent any transmission of corrupted data to the link partner.

Additional requirements for DCD calibration may include: (i) after exiting CVP into user mode, the link must remain up during DCD calibration; and (ii) no active components in the transceivers should be reset during DCD calibration to prevent any state losses.

The present disclosure teaches methods and apparatus that provides efficient DCD calibration. The methods and apparatus may be used for DCD calibration of transceivers under various protocols. For example, the methods and apparatus may be used for DCD calibration of a PCIe Endpoint with CVP or a PCIe Endpoint in other operating modes. The methods and apparatus may also be used with link protocols other than PCIe. The methods and apparatus disclosed herein may be used to advantageously ensure that the signal jitter is reduced or minimized to values within the specification requirements.

Exemplary System

Figure 1:
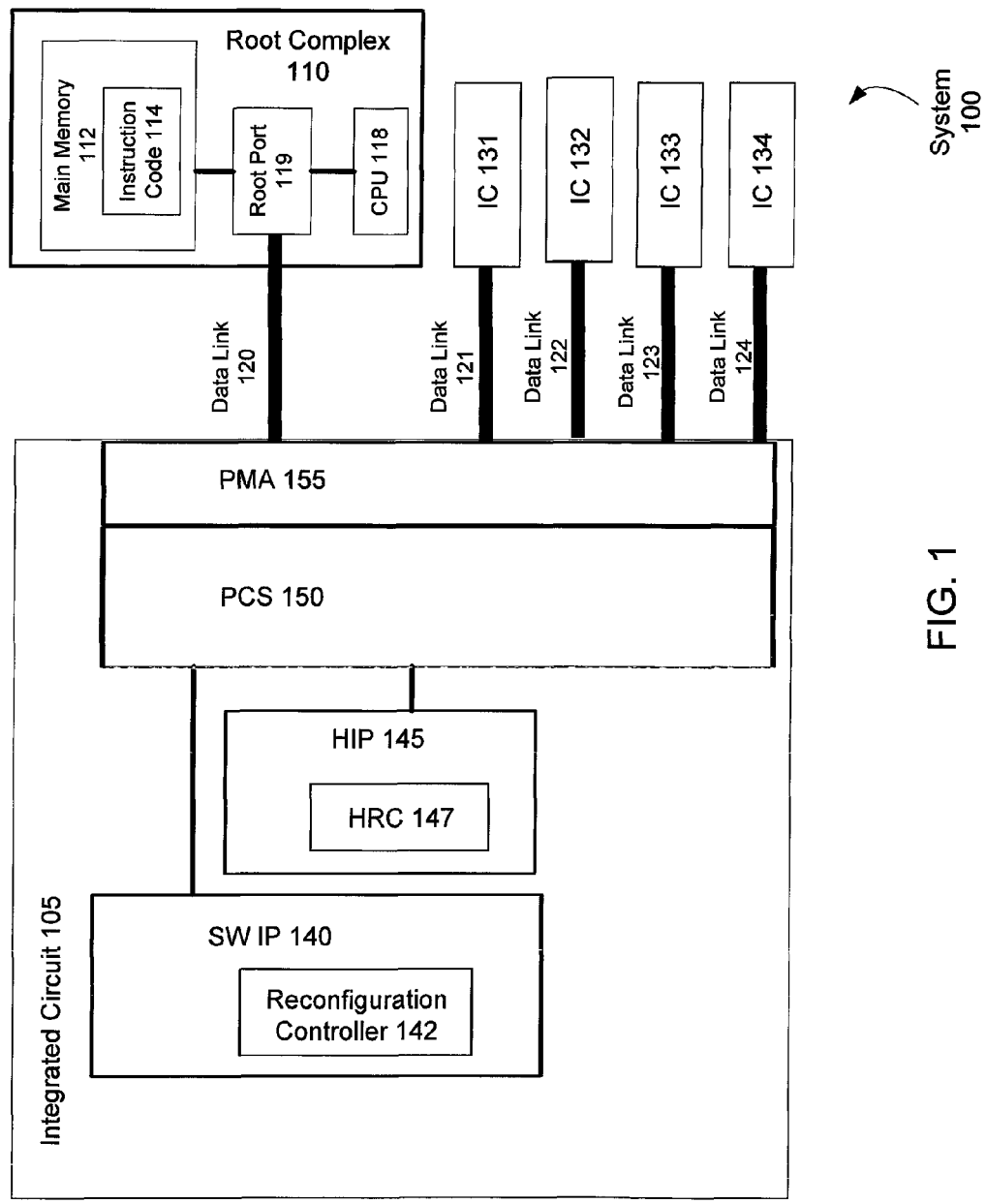
FIG. 1 depicts an exemplary electronic system including data links between integrated circuits in accordance with an embodiment of the invention.

FIG. 1 depicts an exemplary electronic system 100 including data links between integrated circuits in accordance with an embodiment of the invention. The exemplary system 100 may include a first integrated circuit (IC) 105 which has data links (shown as 120, 121, 122, 123 and 124) to a root complex 110 and other ICs (shown as 131, 132, 133 and 134). The DCD calibration technique disclosed herein may be implemented using such a system 100.

In an exemplary implementation, the IC 105 may be a field programmable gate array (FPGA). In other implementations, the IC 105 may be another type of programmable logic device, or another type of IC, such as an application-specific integrated circuit or a microprocessor. In one implementation, the data link 160 may be a PCI Express data link. Other types of data links may be used in other implementations.

As shown, the IC 105 includes physical coding sublayer (PCS) circuit modules 150 and physical media attachment (PMA) circuit modules 155 so as to implement multiple transceiver channels. The PCS circuit modules 150 generally provide digital logic functions which implement data communication protocols, while the PMA circuit modules 155 generally provide mixed (analog/digital) signal functionality for the data communications.

For example, for certain protocols, a PCS circuit module may perform, among other functions, 64-bit to 66-bit encoding for data to be sent to the PMA circuitry and 66-bit to 64-bit decoding for data received from the PMA circuitry. A PMA circuit module may perform, among other functions, serialization of data to be transmitted (conversion from parallel to serial) and de-serialization of received data (conversion from serial to parallel).

The IC 105 may also include hard-wired intellectual property (HIP) circuit modules 145 and soft-wired intellectual property (SW IP) circuit modules 140. The HIP circuit modules 145 may include a hard reset controller (HRC) 147. The SW IP circuit modules 140 may include a reconfiguration controller 142.

The root complex 110 may include a root port 119, main memory 112 and a CPU 118. The root port 119 may connect to the data link 120 for communicating data with the IC 105. The CPU 118 and the main memory 112 also communicatively interconnect to the root port 119. The main memory 112 may hold instruction code 114 and data. The CPU 118 may execute the instruction code 114 and so process data.

Exemplary Method for DCD Calibration

Figure 2:
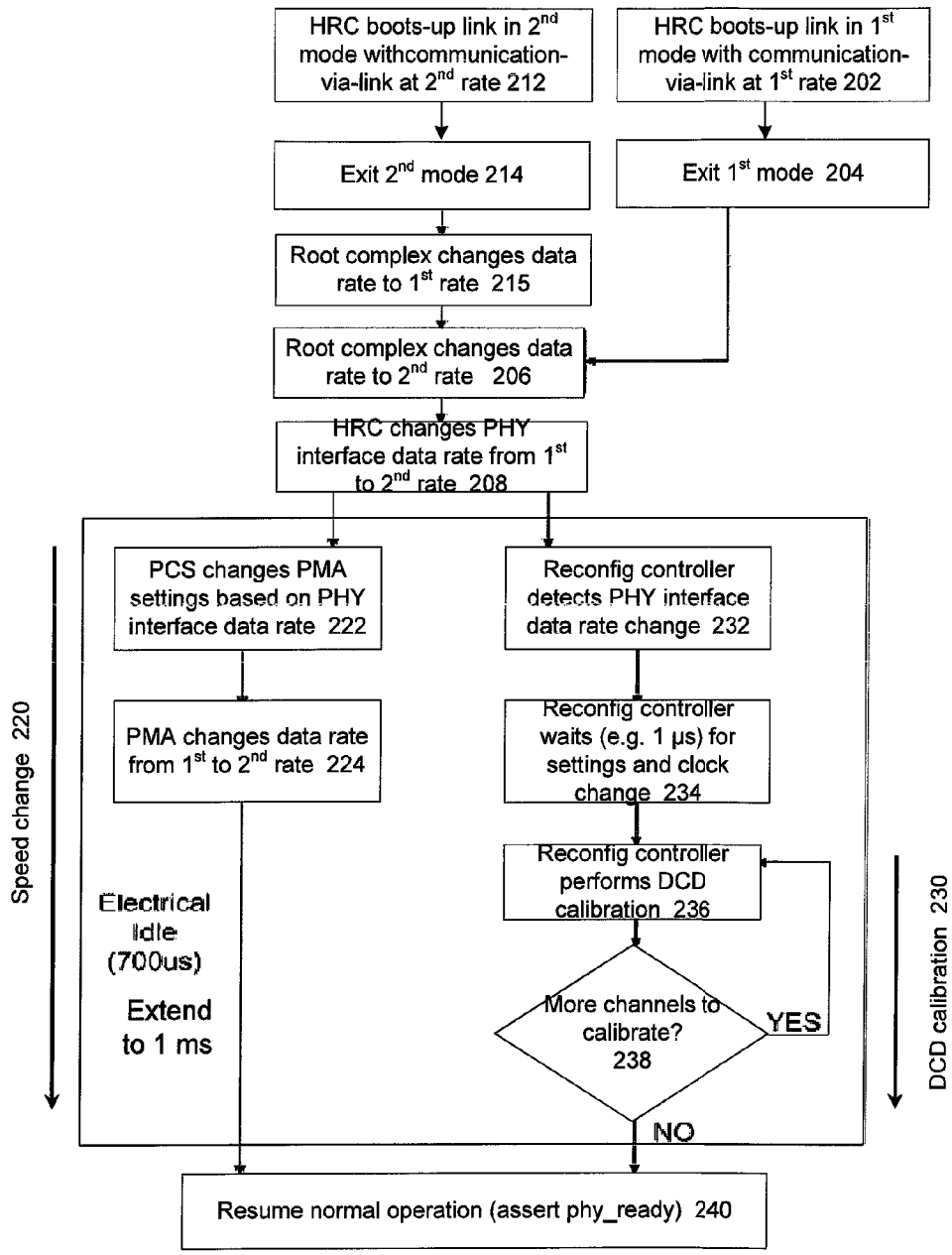
FIG. 2 is a flow chart showing an exemplary method of DCD calibration of one or more transceiver channels in accordance with an embodiment of the invention.

FIG. 2 is a flow chart showing an exemplary method 200 of DCD calibration of one or more transceiver channels in accordance with an embodiment of the invention. The method 200 of FIG. 2 may be performed by the system 100 of FIG. 1, for example.

Two scenarios for the method 200 are depicted in the top part of FIG. 2. In the first scenario, the link is booted up with communications-via-link at a first (lower) data rate. This first scenario involves blocks 202, 204, 206 and 208. In the second scenario, the link is booted up with communications-via-link at a second (higher) data rate. This second scenario involves blocks 212, 214, 216, 206 and 208.

In the first scenario, per block 202, the method 200 may begin when the HRC boots-up a link in the first mode with communication via the link at the first (lower) data rate. For example, the link that is booted-up may be data link 120 from IC 105 to root complex 110 in FIG. 1 In one implementation, for example, the first mode may be PCIe Gen1 with CVP which has a data rate of 2.5 Gbps. After the first mode is exited (with communication-via-link enabled and completed) per block 204, the root complex may change the data rate of the link to a second data rate per block 206. For example, in an exemplary implementation, the second data rate may be 5.0 Gbps which is the data rate of PCIe Gen2. The change to the second data rate by the root complex per block 206 may then trigger the HRC to change the data rate of the physical layer (PHY) interface from the first data rate to the second data rate per block 208.

In the second scenario, per block 212, the method 200 may begin when the HRC boots-up a link in the second mode with communication via the link at the second (higher) data rate. For example, in one implementation, the second mode may be PCIe Gen2 with CVP which has a data rate of 5.0 Gbps. After the second mode is exited (with communication-via-link enabled and completed) per block 214, the root complex may intentionally change (downgrade) the data rate of the link to the first (lower) data rate per block 215. For example, in an exemplary implementation, the first data rate may be 2.5 Gbps which is the data rate of PCIe Gen1. Thereafter, the root complex may change (upgrade) the data rate of the link back to the second data rate per block 206. The change to the second data rate by the root complex per block 206 may then trigger the HRC to change the data rate of the physical layer (PHY) interface from the first data rate to the second data rate per block 208.

In either scenario, after block 208, the method 200 then proceeds along two parallel procedural paths. A first procedural path 220 implements the speed change, and a second procedural path 230 provides the DCD calibration.

In the first path 220, per block 222, the PCS changes the PMA settings based on the PHY interface data rate. This may be done for multiple transceivers associated with the PHY interface. Thereafter, per block 224, the PMA implements the change in the data rate from the first rate to the second rate. In an exemplary implementation, the PMA changes the data rate from 2.5 Gbps to 5.0 Gbps in less than twenty unit intervals. Thereafter, the link (both transmitter and receiver) may be in an electrical idle state. In an exemplary implementation, the electrical idle state may be approximately 700 microseconds long and may extend to 1 millisecond in length.

In the second path 230, per block 232, the reconfiguration (Reconfig) controller detects the PHY interface data rate change from the first rate to the second rate. Per block 234, the reconfiguration controller then waits for a short time (for example, one microsecond) for the change to settings and clock to be made. In other words, per block 234, the reconfiguration controller waits a sufficient amount of time for the steps in blocks 222 and 224 to be performed.

Thereafter, per block 236, the reconfiguration controller may perform the DCD calibration for a single channel. Per block 238, a determination may then be made as to whether there are more channels to calibrate. If so, then the method 200 may loop back to block 236 and perform DCD calibration for a next single channel. In an exemplary implementation, the channels may correspond to the data links 121, 122, 123 and 124 in FIG. 1. Once there are no more channels to calibrate, then normal operation may be resumed (for example, by asserting a phy_ready signal) per block 240.

In an exemplary implementation, the DCD calibration for a single channel may be performed in about 120 microseconds (9,000 cycles with a 75 MHz reconfiguration clock) while the electrical idle may be up to one millisecond. In this implementation, the electrical idle time is sufficient to perform DCD calibration of up to 8 channels.

Advantageously, in accordance with an embodiment of the invention, the DCD calibration of the channels in the second procedural path is performed during a window of opportunity provided by the electrical idle after the speed change in the first procedural path. Furthermore, the DCD calibration for the second data rate is advantageously performed at the second (higher) data rate; DCD calibration at the first (lower) data rate may worsen the signal jitter.

Note that, while the above discussion relates to a link with a communication-via-link mode, the technique disclosed herein may also be applied to a link without the communication-via-link mode. In this case, the reconfiguration controller may initiate the DCD calibration in parallel (i.e. in the background) when there is a speed change from the first (lower) data rate to the second (higher) data rate in the user mode.

More generally, the technique disclosed herein may be applied to high-speed serial protocols with dynamic speed changes which are affected by the need for DCD calibration. The dynamic change from the PCIe Gen1 data rate to the PCIe Gen2 data rate is just one example of such a speed change.

Exemplary Technique for DCD Calibration of a Single Channel

Figure 3:
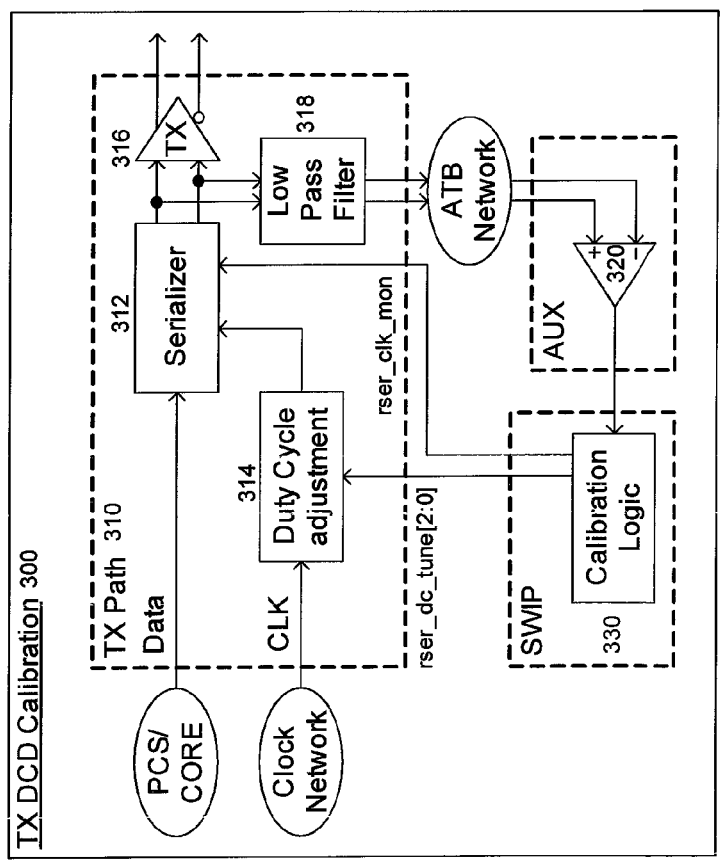
FIG. 3 shows an exemplary circuit apparatus for DCD calibration of a single channel in accordance with an embodiment of the invention.

FIG. 3 shows an exemplary circuit apparatus 300 for DCD calibration of a single channel in accordance with an embodiment of the invention. The apparatus 300 may include a transmitter data path (TX path) 310, a comparator 320 in auxiliary (AUX) circuitry, and calibration logic 330 in SW IP.

The TX path 310 includes a serializer 312, duty cycle adjustment circuit module (duty cycle adjuster) 314, (differential) transmission (TX) buffer 316, and low pass filter 318. The serializer 312 may receive data in parallel from the IC core via the PCS and may also receive a control signal from the duty cycle adjuster 314 and a clock-monitor control signal (rser_clk_mon) from the calibration logic 330. The serializer 312 may output a (differential) serial bit stream to the TX buffer 316. The duty cycle adjuster 314 may receive a clock signal CLK from a clock network and a duty cycle (DC) tuning control signal (rser_dc_tune[2:0]) from the calibration logic 330 and may provide a control signal to control the duty cycle of the serializer 312.

The low pass filter 318 may also receive the (differential) serial data signal from the serializer 312 and may apply a low-pass filter function to the data signal. The low pass filter 318 may provide its output (via an ATB network, for example) to the comparator 320, and the comparator 320 may output a signal to the calibration logic 330. The output of the comparator 320 may indicate whether the output of the low pass filter 318 is at a positive or negative (i.e. higher or lower) voltage relative to a reference voltage.

Figure 4:
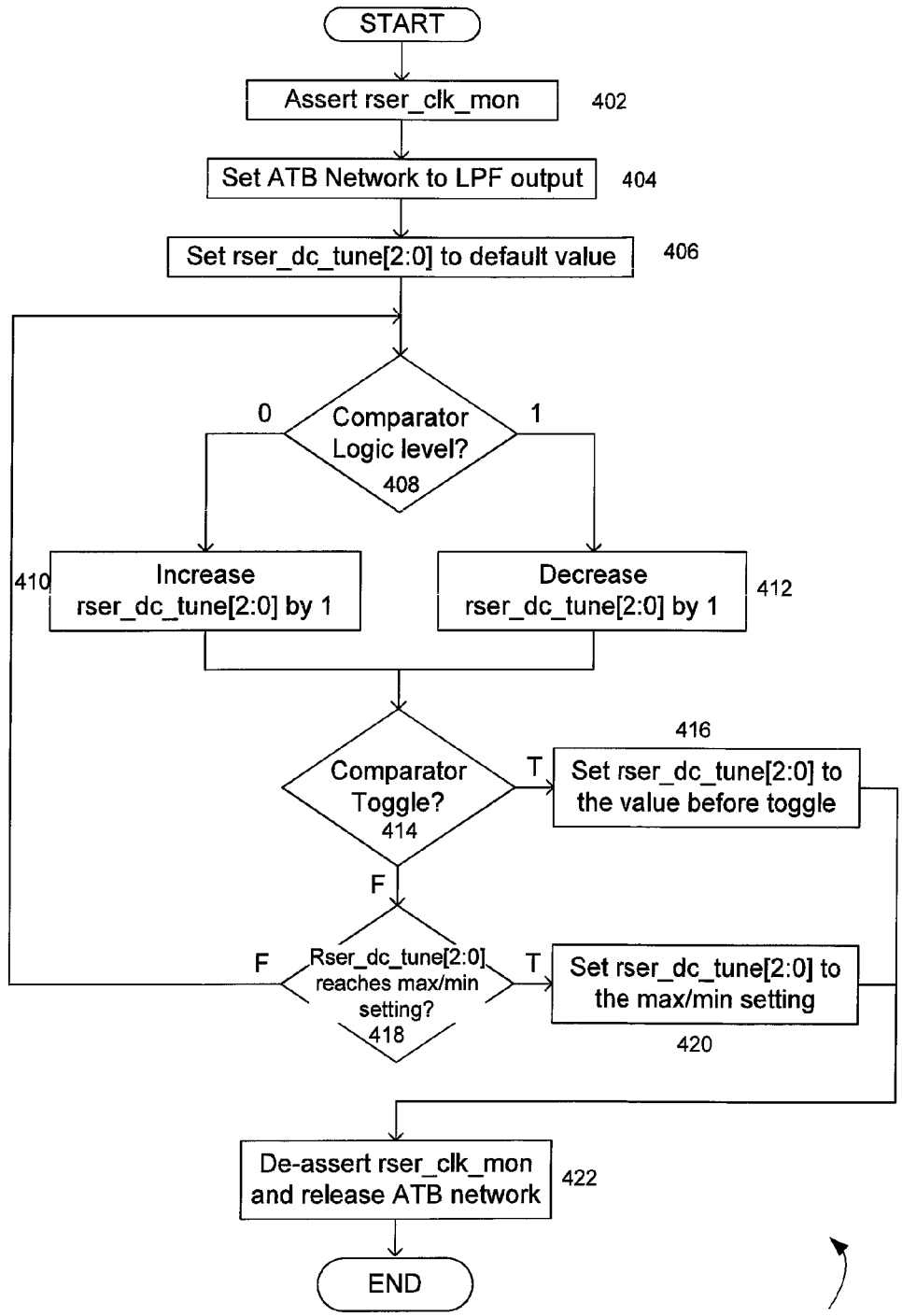
FIG. 4 is a flow chart of an exemplary method 400 of DCD calibration of a single channel in accordance with an embodiment of the invention.

FIG. 4 is a flow chart of an exemplary method 400 of DCD calibration of a single channel in accordance with an embodiment of the invention. The method 400 may be performed using the circuit apparatus 300 of FIG. 3.

Per block 402, the clock-monitor (rser_clk_mon) control signal may be asserted by the calibration logic 330 to the serializer 312. Per block 404, the ATB network may be set to provide low-pass filter output to the comparator 320. Per block 406, the DC-tuning control signal (rser_dc_tune) may be set to an initial default value.

Per block 408, a determination may be made by the calibration logic 330 as to whether the comparator output logic level is zero (low) or one (high). If the logic level is zero, then rser_dc_tune may be incremented per block 410. If the logic level is one, then rser_dc_tune may be decremented per block 412.

Per block 414, a determination may be made by the calibration logic 330 as to whether the logic level of the comparator has just toggled.

If it is true (T) that the logic level has toggled, then rser_dc_tune may be set to the value before the toggle occurred per block 416. Tuning is then complete (i.e. the DCD calibration of the channel is complete) so that the method 400 may finish by de-asserting rser_clk_mon and releasing the ATB network per block 422.

If it is false (F) that the logic level has toggled, then, per block 418, a determination may be made as to whether rser_dc_tune has reached a maximum or minimum setting. If a maximum or minimum setting has been reached (T), then rser_dc_tune may be set to the maximum or minimum setting, as appropriate. Tuning is then complete (i.e. the DCD calibration of the channel is complete) so that the method 400 may finish by de-asserting rser_clk_mon and releasing the ATB network per block 422.

If a maximum or minimum setting has not been reached (F), then the method 400 loops back to block 408. The method 400 thus continues until the tuning is complete.

Exemplary FPGA

Figure 5:
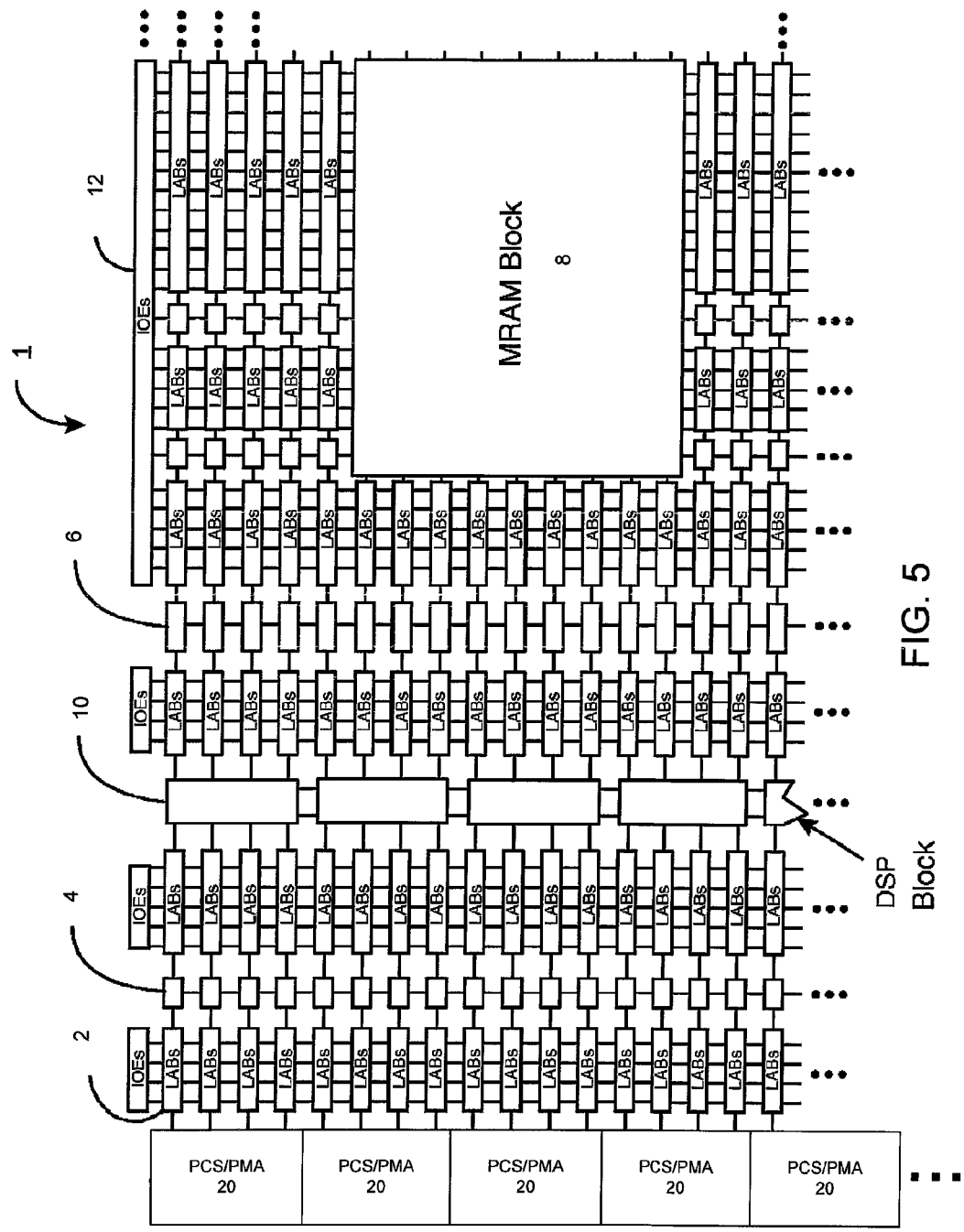
FIG. 5 is a simplified partial block diagram of a field programmable gate array (FPGA) that can include aspects of the present invention.

FIG. 5 is a simplified partial block diagram of a field programmable gate array (FPGA) 10 that can include aspects of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10. An array of PCS and PMA circuit modules 20 may be arranged as shown, for example, with each PCS/PMA channel being coupled to several LABs.

It is to be understood that FPGA 10 is described herein for illustrative purposes only and that the present invention can be implemented in many different types of PLDs, FPGAs, and ASICs.

Conclusion

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A method of calibrating duty cycle distortion, the method comprising:
 changing a data rate of a physical layer interface from a first rate to a second rate, wherein the first rate is lower than the second rate;
 changing a data rate of one or more transceivers associated with the physical layer interface from the first rate to the second rate;
 maintaining an electrical idle state after changing the data rate of the one or more transceivers;
 performing a duty cycle distortion calibration for a first transceiver of said one or more transceivers during the electrical idle state; and once there are no more transceivers to calibrate, ending the electrical idle state and resuming operation of the physical layer interface by asserting a ready signal.

2. The method of claim 1, further comprising:
after performing the duty cycle distortion calibration for the first transceiver, performing a duty cycle distortion calibration for a second transceiver of said one or more transceivers during the electrical idle state.

3. The method of claim 2, further comprising:
after performing the duty cycle distortion calibration for the second transceiver, performing a duty cycle distortion calibration for a third transceiver of said one or more transceivers during the electrical idle state; and
after performing the duty cycle distortion calibration for the third transceiver, performing duty cycle distortion calibration for a fourth transceiver of said one or more transceivers during the electrical idle state.

4. The method of claim 1, wherein the duty cycle distortion calibration comprises:
applying a low-pass filter to a differential serial data signal to obtain a low-pass filter output signal;
generating a comparator output based on the low-pass filter output signal;
incrementing a duty cycle control signal when the comparator output is low; and
decrementing the duty cycle control signal when the comparator output is high.

5. The method of claim 4, wherein the duty cycle distortion calibration for the first transceiver further comprises:
determining whether the comparator output has toggled; and
setting the duty cycle control signal to a value before the toggle and ending the duty cycle distortion calibration for the first transceiver if the comparator output has toggled.

6. The method of claim 4, wherein the duty cycle distortion calibration for the first transceiver further comprises:
if the duty cycle control signal has reached a maximum level, then setting the duty cycle control signal to the maximum level and ending the duty cycle distortion calibration for the first transceiver; and
if the duty cycle control signal has reached a minimum level, then setting the duty cycle control signal to the minimum level and ending the duty cycle distortion calibration for the first transceiver.

7. The method of claim 1, further comprising:
booting-up a data link to a root complex in a first mode, wherein a data rate of the data link in the mode is the first rate;
exiting the mode;
changing the data rate of the data link by the root complex from the first rate to the second rate.

8. The method of claim 1, further comprising:
booting-up a data link to a root complex in a mode, wherein a data rate of the data link in the mode is the second rate;
exiting the mode;
changing the data rate of the data link by the root complex from the second rate to the first rate;
changing the data rate of the data link by the root complex from the first rate to the second rate.

9. An apparatus for calibrating duty cycle distortion, the apparatus comprising:
a reset controller that changes a data rate of a physical layer interface from a first rate to a second rate, wherein the first rate is lower than the second rate;
physical coding sublayer circuitry of the physical layer interface that changes a data rate of one or more physical media attachment channels of the physical layer interface from the first rate to the second rate and that maintains an electrical idle state after changing the data rate of the one or more physical media attachment channels;
a reconfiguration controller that performs a duty cycle distortion calibration for a first physical media attachment channel of said one or more physical media attachment channels during the electrical idle state; and,
wherein once there are no more physical media attachment channels to calibrate, the electrical idle state is exited, and operation of the physical layer interface is resumed by asserting a ready signal.

10. The apparatus of claim 9, wherein the reconfiguration controller, after performing the duty cycle distortion calibration for the first transceiver, performs a duty cycle distortion calibration for a second transceiver of said one or more transceivers during the electrical idle state.

11. The apparatus of claim 10, wherein the reconfiguration controller, after performing the duty cycle distortion calibration for the second transceiver, performs duty cycle distortion calibration for a third transceiver of said one or more transceivers during the electrical idle state, and, after performing the duty cycle distortion calibration for the third transceiver, performs a duty cycle distortion calibration for a fourth transceiver of said one or more transceivers during the electrical idle state.

12. The apparatus of claim 9, wherein the apparatus further comprises a low-pass filter and a comparator, and wherein the duty cycle distortion calibration performed by the reconfiguration controller comprises:
applying a low-pass filter to a differential serial data signal to obtain a low-pass filter output signal;
generating a comparator output based on the low-pass filter output signal;
incrementing a duty cycle control signal when the comparator output is low; and
decrementing the duty cycle control signal when the comparator output is high.

13. The apparatus of claim 12, wherein the duty cycle distortion calibration performed by the reconfiguration controller further comprises:
determining whether the comparator output has toggled; and
setting the duty cycle control signal to a value before the toggle and ending the duty cycle distortion calibration for the first transceiver if the comparator output has toggled.

14. The apparatus of claim 12, wherein the duty cycle distortion calibration performed by the reconfiguration controller further comprises:
if the duty cycle control signal has reached a maximum level, then setting the duty cycle control signal to the maximum level and ending the duty cycle distortion calibration for the first transceiver; and
if the duty cycle control signal has reached a minimum level, then setting the duty cycle control signal to the minimum level and ending the duty cycle distortion calibration for the first transceiver.

15. The apparatus of claim 9, wherein the reset controller boots-up a data link to a root complex in a mode, wherein a data rate of the data link in the mode is the first rate, exits the mode, and changes the data rate of the data link from the first rate to the second rate.

16. The apparatus of claim 9, wherein the reset controller boots-up a data link to a root complex in a mode, wherein a data rate of the data link in the mode is the second rate, exits the mode, changes the data rate of the data link from the second rate to the first rate, and changes the data rate of the data link from the first rate to the second rate.

17. A system for calibrating duty cycle distortion, the system comprising:
- an integrated circuit;
- a root complex of a system; and
- a data link between the integrated circuit to the root complex,
- wherein the integrated circuit comprises
    - a reset controller that changes a data rate of a physical layer interface for the data link from a first rate to a second rate, wherein the first rate is lower than the second rate,
    - physical coding sublayer circuitry of the physical layer interface that changes a data rate of one or more physical media attachment channels of the physical layer interface from the first rate to the second rate and that maintains an electrical idle state after changing the data rate of the one or more physical media attachment channels, and
    - a reconfiguration controller that performs duty cycle distortion calibration for a first physical media attachment channel of the one or more physical media attachment channels during the electrical idle state.

* * * * *